(12) United States Patent
Lee et al.

(10) Patent No.: US 8,124,446 B2
(45) Date of Patent: Feb. 28, 2012

(54) STRUCTURE OF HIGH PERFORMANCE COMBO CHIP AND PROCESSING METHOD

(75) Inventors: Jin-Yuan Lee, Hsin-Chu (TW); Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 366 days.

(21) Appl. No.: 11/842,958

(22) Filed: Aug. 22, 2007

(65) Prior Publication Data
US 2008/0070346 A1    Mar. 20, 2008

Related U.S. Application Data

(60) Continuation of application No. 10/614,928, filed on Jul. 8, 2003, now Pat. No. 7,282,804, which is a division of application No. 09/953,544, filed on Sep. 17, 2001, now Pat. No. 6,613,606.

(51) Int. Cl.
*H01L 21/00* (2006.01)
(52) U.S. Cl. .................................... 438/106; 438/107
(58) Field of Classification Search .................. 438/122, 438/106, 107
See application file for complete search history.

(56) References Cited

U.S. PATENT DOCUMENTS

| | | | |
|---|---|---|---|
| 3,668,484 A | 6/1972 | Greig | |
| 4,825,276 A | 4/1989 | Kobayashi | |
| 5,081,563 A | 1/1992 | Feng | |
| 5,083,187 A | 1/1992 | Lamson | |
| 5,239,447 A | 8/1993 | Cotues | |
| 5,422,435 A | 6/1995 | Takiar | |
| 5,468,984 A | 11/1995 | Efland | |
| 5,534,465 A | 7/1996 | Frye | |
| 5,596,227 A | 1/1997 | Saito | |
| 5,608,262 A | 3/1997 | Degani | |
| 5,659,952 A | 8/1997 | Kovac | |
| 5,688,716 A | 11/1997 | DiStefano et al. | |
| 5,780,925 A | 7/1998 | Cipolla | |
| 5,790,384 A | 8/1998 | Ahmad | |
| 5,811,351 A | 9/1998 | Kawakita | |
| 5,866,949 A | 2/1999 | Schueller | |
| 5,870,289 A | 2/1999 | Tokuda | |
| 5,874,781 A | 2/1999 | Fogal | |

(Continued)

FOREIGN PATENT DOCUMENTS
TW    337036    7/1998
(Continued)

OTHER PUBLICATIONS

Dufrense, J. et al., "Hybrid Assembly Technology for Flip-Chip-on-Chip (FCOC) Using PBGA Laminate Assembly," pp. 541-548, IEEE Electronic Components and Technology Conference, May 21-24, 2000.

(Continued)

*Primary Examiner* — Douglas Menz
(74) *Attorney, Agent, or Firm* — McDermott Will & Emery LLP

(57) ABSTRACT

A method for fabricating a chip package is achieved. A seed layer is formed over a silicon wafer. A photoresist layer is formed on the seed layer, an opening in the photoresist layer exposing the seed layer. A first solder bump is formed on the seed layer exposed by the opening. The photoresist layer is removed. The seed layer not under the first solder bump is removed. A second solder bump on a chip is joined to the first solder bump.

23 Claims, 12 Drawing Sheets

U.S. PATENT DOCUMENTS

| | | | |
|---|---|---|---|
| 5,915,170 | A | 6/1999 | Raab et al. |
| 5,952,725 | A | 9/1999 | Ball |
| 5,983,492 | A | 11/1999 | Fjelstad |
| 5,989,939 | A | 11/1999 | Fjelstad |
| 5,994,166 | A | 11/1999 | Akram |
| 6,012,224 | A | 1/2000 | DiStefano et al. |
| 6,015,505 | A | 1/2000 | David et al. |
| 6,020,220 | A | 2/2000 | Gilleo et al. |
| 6,051,878 | A | 4/2000 | Akram |
| 6,054,337 | A | 4/2000 | Solberg |
| 6,084,308 | A | 7/2000 | Kelkar |
| 6,087,722 | A | 7/2000 | Lee et al. |
| 6,121,682 | A | 9/2000 | Kim |
| 6,133,636 | A | 10/2000 | Akram |
| 6,133,639 | A | 10/2000 | Kovac et al. |
| 6,147,401 | A | 11/2000 | Solberg |
| 6,157,080 | A | 12/2000 | Tamaki |
| 6,165,815 | A | 12/2000 | Ball |
| 6,168,969 | B1 | 1/2001 | Farnworth |
| 6,177,731 | B1 | 1/2001 | Ishida |
| 6,180,426 | B1 | 1/2001 | Lin |
| 6,207,467 | B1 | 3/2001 | Vaiyapuri |
| 6,211,572 | B1 | 4/2001 | Fjelstad et al. |
| 6,222,265 | B1 | 4/2001 | Akram |
| 6,229,220 | B1 | 5/2001 | Saitoh |
| 6,229,711 | B1 | 5/2001 | Yoneda |
| 6,236,109 | B1 | 5/2001 | Hsuan et al. |
| 6,239,367 | B1 | 5/2001 | Hsuan et al. |
| 6,239,496 | B1 | 5/2001 | Asada |
| 6,252,301 | B1 | 6/2001 | Gilleo et al. |
| 6,265,766 | B1 | 7/2001 | Moden |
| 6,274,937 | B1 | 8/2001 | Ahn et al. |
| 6,284,563 | B1 | 9/2001 | Fjelstad |
| 6,294,406 | B1 | 9/2001 | Bertin |
| 6,300,254 | B1 | 10/2001 | Raab |
| 6,303,997 | B1 | 10/2001 | Lee |
| 6,313,528 | B1 | 11/2001 | Solberg |
| 6,340,846 | B1 | 1/2002 | LoBianco |
| 6,359,335 | B1 | 3/2002 | DiStefano et al. |
| 6,365,499 | B1 | 4/2002 | Nakamura |
| 6,369,448 | B1 | 4/2002 | McCormick |
| 6,413,798 | B2 | 7/2002 | Asada |
| 6,451,624 | B1 | 9/2002 | Farnworth |
| 6,465,878 | B2 | 10/2002 | Fjelstad et al. |
| 6,489,676 | B2 | 12/2002 | Taniguchi |
| 6,504,227 | B1 | 1/2003 | Matsuo et al. |
| 6,538,331 | B2 | 3/2003 | Masuda |
| 6,541,847 | B1 | 4/2003 | Hofstee |
| 6,558,978 | B1 | 5/2003 | McCormick |
| 6,586,266 | B1 | 7/2003 | Lin |
| 6,596,624 | B1 * | 7/2003 | Romankiw .......... 438/619 |
| 6,613,606 | B1 | 9/2003 | Lee |
| 6,642,610 | B2 | 11/2003 | Park |
| 6,653,563 | B2 | 11/2003 | Bohr |
| 6,707,149 | B2 | 3/2004 | Smith |
| 6,707,159 | B1 | 3/2004 | Kumamoto |
| 6,716,671 | B2 | 4/2004 | Warner et al. |
| 6,723,584 | B2 | 4/2004 | Kovac et al. |
| 6,756,664 | B2 | 6/2004 | Yang |
| 6,762,122 | B2 | 7/2004 | Mis |
| 6,765,299 | B2 | 7/2004 | Takahashi |
| 6,774,473 | B1 | 8/2004 | Shen |
| 6,774,475 | B2 | 8/2004 | Blackshear |
| 6,791,178 | B2 | 9/2004 | Yamaguchi |
| 6,847,101 | B2 | 1/2005 | Fjelstad et al. |
| 6,847,107 | B2 | 1/2005 | Fjelstad et al. |
| 6,870,272 | B2 | 3/2005 | Kovac et al. |
| 6,963,136 | B2 | 11/2005 | Shinozaki |
| 6,977,435 | B2 | 12/2005 | Kim |
| 7,045,899 | B2 | 5/2006 | Yamane |
| 7,074,050 | B1 | 7/2006 | Bartley |
| 7,084,660 | B1 | 8/2006 | Ackaret |
| 7,112,879 | B2 | 9/2006 | Fjelstad et al. |
| 7,152,311 | B2 | 12/2006 | Beroz et al. |
| 7,247,932 | B1 | 7/2007 | Lin |
| 7,282,804 | B2 | 10/2007 | Lee |
| 7,408,260 | B2 | 8/2008 | Fjelstad et al. |
| 7,505,284 | B2 | 3/2009 | Offrein |
| 7,517,778 | B2 | 4/2009 | Lee et al. |
| 2001/0007375 | A1 | 7/2001 | Fjelstad et al. |
| 2001/0040290 | A1 | 11/2001 | Sakurai |
| 2002/0100961 | A1 | 8/2002 | Fjelstad et al. |
| 2002/0115236 | A1 | 8/2002 | Fjelstad et al. |
| 2002/0195685 | A1 | 12/2002 | Fjelstad et al. |
| 2004/0227225 | A1 | 11/2004 | Fjelstad et al. |
| 2006/0237836 | A1 | 10/2006 | Fjelstad et al. |
| 2006/0261476 | A1 | 11/2006 | Fjelstad et al. |
| 2008/0070345 | A1 | 3/2008 | Lin et al. |
| 2008/0070346 | A1 | 3/2008 | Lin et al. |
| 2008/0284037 | A1 | 11/2008 | Andry |
| 2009/0057901 | A1 | 3/2009 | Lin et al. |
| 2009/0065937 | A1 | 3/2009 | Lin et al. |

FOREIGN PATENT DOCUMENTS

| | | |
|---|---|---|
| TW | 369690 | 9/1998 |
| TW | 415056 | 12/2000 |
| TW | 432562 | 5/2001 |
| TW | 445599 | 7/2001 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of EDS Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Hoffman, P.; "System in Package"; Amkor Technology; Presentation at 8th KGD Workshop; Napa, CA; Sep. 9-11, 2001.

* cited by examiner

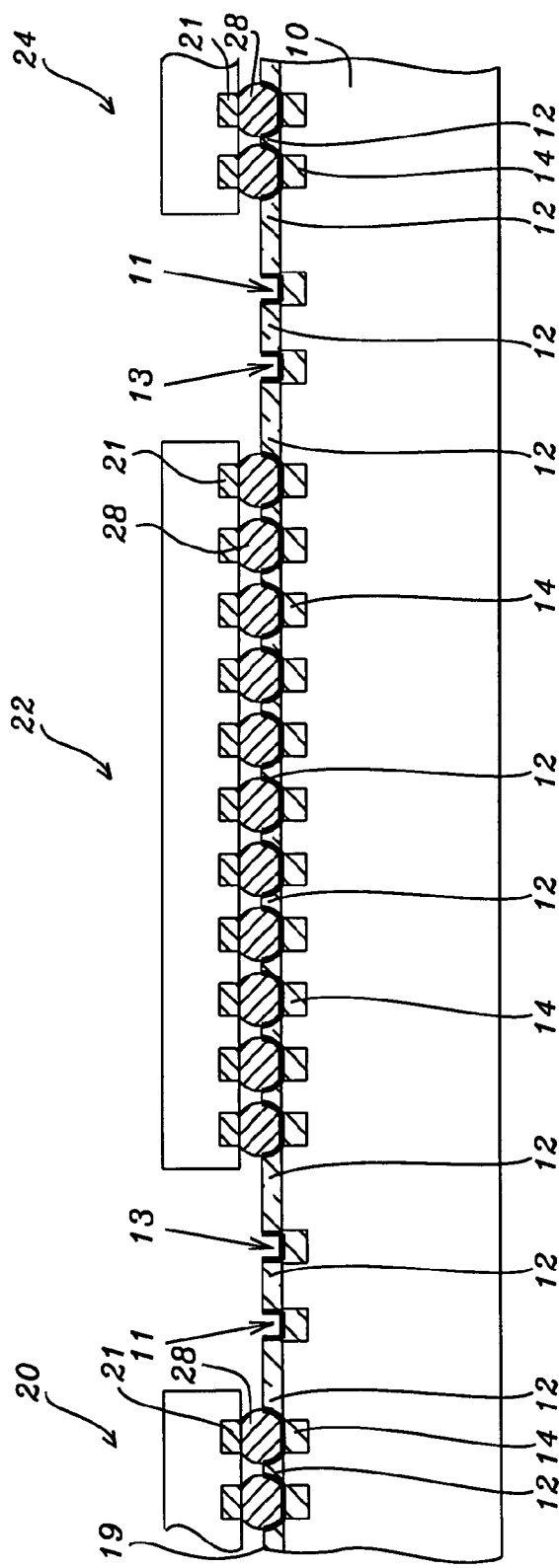
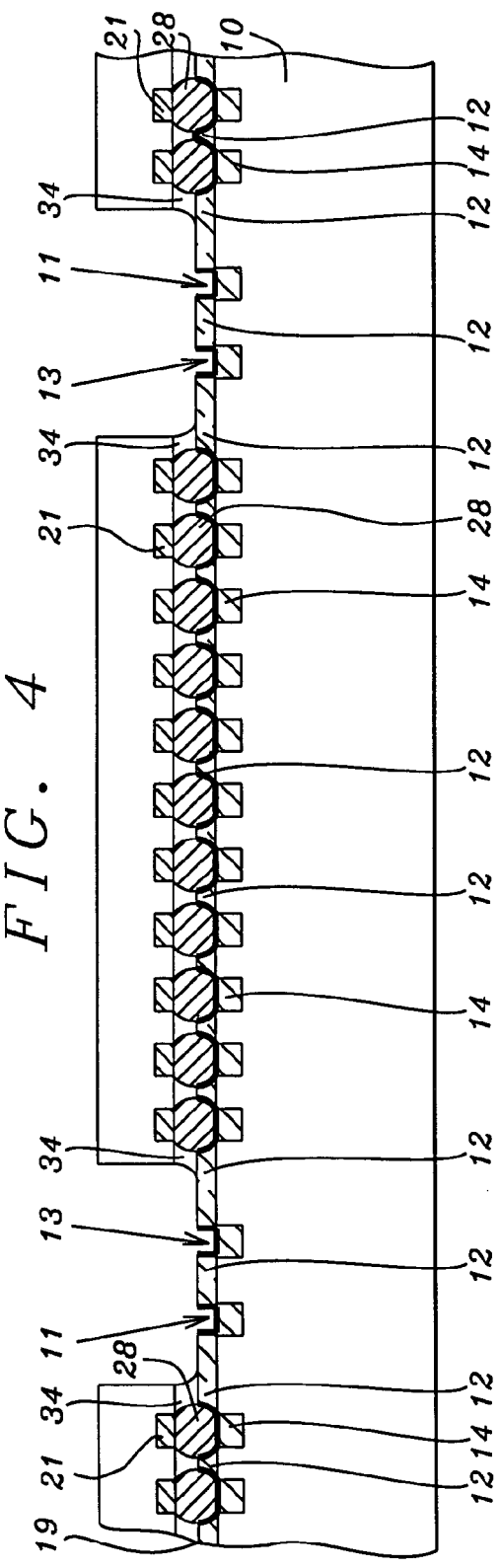
FIG. 4
FIG. 5

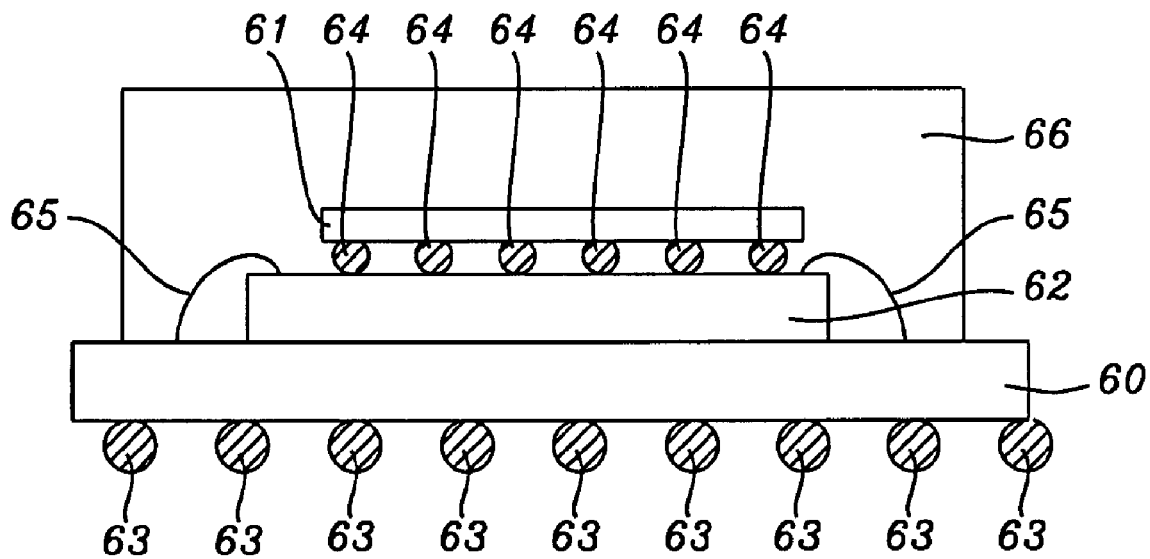
FIG. 12 – Prior Art
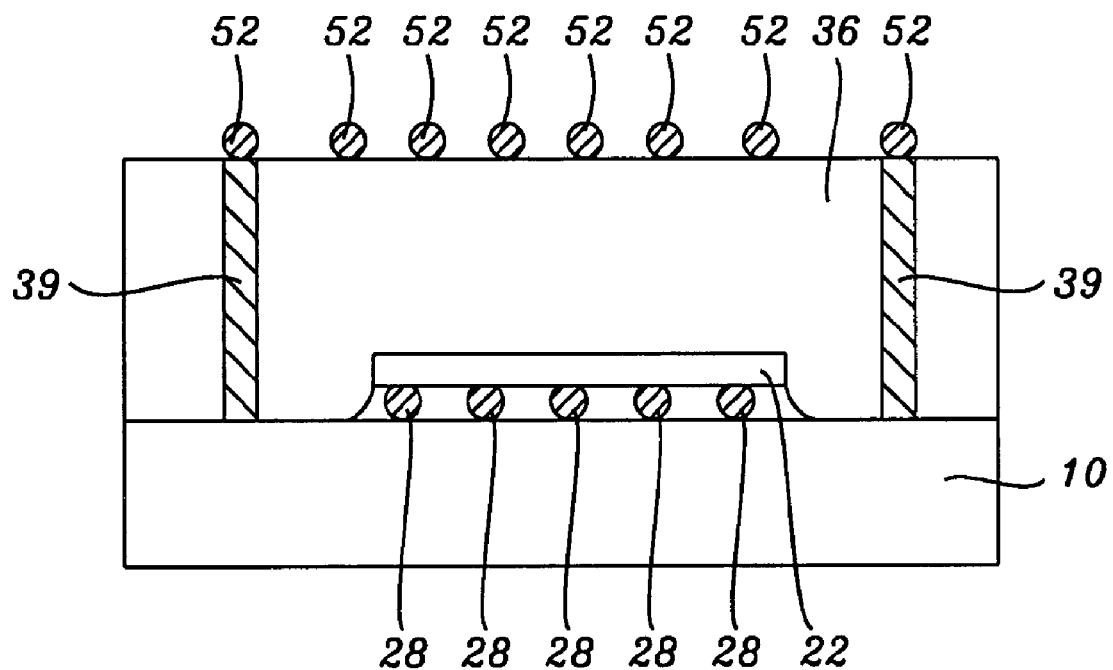
FIG. 13

STRUCTURE OF HIGH PERFORMANCE COMBO CHIP AND PROCESSING METHOD

This is a continuation of application Ser. No. 10/614,928, filed on Jul. 8, 2003, now pending, which is a division of application Ser. No. 09/953,544, filed on Sep. 17, 2001, now U.S. Pat. No. 6,613,606.

BACKGROUND OF THE INVENTION (1) Field of the Invention

The invention relates to the fabrication of integrated circuit devices, and more particularly, to a method and package for the mounting of multiple semiconductor devices in one semiconductor device package.

(2) Description of the Prior Art

Continued progress in the semiconductor industry is achieved by continuous reduction in semiconductor device dimensions, this reduction in semiconductor device geometry must be achieved at a cost for the manufacturing of semiconductor devices that remains competitive. Interactive and mutually supporting technologies are used for this purpose, in many of the applications the resulting device density is further accommodated and supported by mounting multiple devices in one package.

In the field of high density interconnect technology, it is therefore frequently necessary to fabricate a multilayer structure on a substrate to connects integrated circuits to one another. To achieve a high wiring and packing density, many integrated circuit chips are physically and electrically connected to a single substrate commonly referred to as a Multi-Chip-Module (MCM). Typically, layers of a dielectric such as a polyimide separate metal power and ground planes in the substrate. Embedded in other dielectric layers are metal conductor lines with vias (holes) providing electrical connections between signal lines or to the metal power and ground planes. Adjacent layers are ordinarily formed so that the primary signal propagation directions are orthogonal to each other. Since the conductor features are typically narrow in width and thick in a vertical direction (in the range of 5 to 10 microns thick) and must be patterned with microlithography, it is important to produce patterned layers that are substantially flat and smooth (i.e. planar) to serve as the base for the next layer.

Surface mounted, high pin count integrated circuit packages have in the past been configured using Quad Flat Packages (QFP's) with various pin configurations. These packages have closely spaced leads for making electrical connections that are distributed along the four edges of the flat package. These packages have become limited by having input/output (I/O) points of interconnect that are confined to the edges of the flat package even though the pin to pin spacing is small. To address this limitation, a new package, a Ball Grid Array (BGA) has been developed which is not confined in this manner because the electrical contact points are distributed over the entire bottom surface of the package. More contact points can thus be located with greater spacing between the contact points than with the QFP's. These contacts are solder balls that facilitate flow soldering of the package onto a printed circuit board.

Developments of increased device density have resulted in placing increased demands on the methods and techniques that are used to access the devices, also referred to as input/output (I/O) capabilities of the device. This has led to new methods of packaging semiconductor devices, whereby structures such as Ball Grid Array (BGA) devices and Column Grid Array (CGA) devices have been developed. A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mil spacings in regular and staggered array patterns. Due to the increased device miniaturization, the impact that device interconnects have on device performance and device cost has also become a larger factor in package development. Device interconnects, due to their increase in length in order to package complex devices and connect these devices to surrounding circuitry, tend to have an increasingly negative impact on the package performance. For longer and more robust metal interconnects, the parasitic capacitance and resistance of the metal interconnection increase, significantly degrading chip performance. Of particular concern in this respect is the voltage drop along power and ground buses and the RC delay that is introduced in the critical signal paths. In many cases the requirements that are placed on metal interconnects result in conflicting performance impacts. For instance, attempts to reduce the resistance by using wider metal lines result in higher capacitance of these wires. It is therefore the trend in the industry to look for and apply metals for the interconnects that have low electrical resistance, such as copper, while at the same time using materials that have low dielectric constants for insulation between interconnecting lines.

One of the more recent developments that is aimed at increasing the Input-Output (I/O) capabilities of semiconductor devices is the development of Flip Chip Packages. Flip-chip technology fabricates bumps (typically Pb/Sn solders) on Al pads on a semiconductor device, the bumps are interconnected directly to the package media, which are usually ceramic or plastic based. The flip-chip is bonded face down to the package medium through the shortest path. This technology can be applied not only to single-chip packaging, but also to higher or integrated levels of packaging, in which the packages are larger while more sophisticated substrates can be used that accommodate several chips to form larger functional units.

The flip-chip technique, using an area interconnect array, has the advantage of achieving the highest density of interconnection to the device and a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

In general, Chip-On-Board (COB) techniques are used to attach semiconductor die to a printed circuit board. These techniques include the technical disciplines of flip chip attachment, wirebonding, and tape automated bonding (TAB). Flip chip attachment consists of attaching a flip chip to a printed circuit board or to another substrate. A flip chip is a semiconductor chip that has a pattern or arrays of terminals that is spaced around an active surface of the flip chip that allows for face down mounting of the flip chip to a substrate.

Generally, the flip chip active surface has one of the following electrical connectors: BGA (wherein an array of minute solder balls is disposed on the surface of the flip chip that attaches to the substrate); Slightly Larger than Integrated Circuit Carrier (SLICC), which is similar to the BGA but has a smaller solder ball pitch and a smaller diameter than the BGA; a Pin Grid Array (PGA), wherein an array of small pins extends substantially perpendicularly from the attachment surface of a flip chip, such that the pins conform to a specific arrangement on a printed circuit board or other substrate for attachment thereto. With the BGA or SLICC, the solder or other conductive ball arrangement on the flip chip must be a mirror image of the connecting bond pads on the printed circuit board so that precise connection can be made. The flip chip is bonded to the printed circuit board by refluxing the solder balls. The solder balls may also be replaced with a conductive polymer. With the PGA, the pin arrangement of the flip chip must be a mirror image of the recesses on the printed circuit board. After insertion, soldering the pins in place generally bonds the flip chip.

Recent developments in the creation of semiconductor integrated devices have seen device features being reduced to the micron and sub-micron range. Continued emphasis on improved device performance requires increased device operating speed, which in turn requires that device dimensions are further reduced. This leads to an approach that is applied to Ultra Large Scale Integration (ULSI) devices, where multi-levels of metal interconnects are used to electrically interconnect the discrete semiconductor devices on the semiconductor chips. In more conventional approaches, the different levels of interconnect are separated by layers of insulating materials. The various adjacent levels of metal can be interconnected by creating via openings in the interposing insulating layers. Typically, an insulating layer is silicon dioxide. Increased reduction of device size coupled with increased device density requires further reduction in the spacing between the metal interconnect lines in order to accomplish effective interconnects of the integrated circuits. This however is accompanied with an increase in capacitive coupling between adjacent lines, an increase that has a negative impact on device performance and on device operating speed. A method must therefore be found whereby devices can be mounted in very close physical proximity to each other without increasing capacitive coupling while also reducing the RC induced time delay of the circuit. One typical approach is to search for insulating layers that have low dielectric constants, ideally the dielectric constant of a vacuum. Another approach is to use electrical conductors for the interconnect lines that have low electrical resistivity thereby reducing the RC time delay. Another approach is to direct the packaging of semiconductor devices in the direction of wafer-like packages. This approach offers the advantages of being able to use standard semiconductor processing equipment and processes while it can readily be adapted to accommodate die shrinkage and to wafer-level burn-in and testing.

Current practice of mounting multiple chips on the surface of one chip carrier has led to the highlighted approaches of Multiple Chip Module (MCM) and Multiple Chip Package (MCP) packaging. These methods of packaging however are expensive while a relatively large size package is typically the result of this method of packaging. A method that can negate these negative aspects of multiple chip packaging is therefore required, the invention provides such a method.

FIG. 12 shows a cross section of a prior art chip assembly in which the following elements are highlighted:
- 60, the basic structure of the package that typically is a Printer Circuit Board; one or more layers of conductive interconnect may have been provided in or on the surface of the PCB 60; contact pads (not shown) are provided on the surface of PCB 60
- 61, the Integrated Circuit die that is at the center of the package; it must be emphasized that more than one IC die can be mounted inside the package of FIG. 12 in a manner similar to the mounting of the one IC die that is shown in FIG. 12
- 62, a substrate interface that has been provided with metal traces on the surface thereof; one or more layers of interconnect metal (such as traces or lines, vias, contact plugs, not shown in FIG. 12) may be provided in or on the surface of the substrate 62; points of electrical contact (not shown) are provided on the surface of substrate 62; conducting vias (not shown) may have been provided through the substrate 62 that connect overlying contact balls 64 with bond pads that have been provided on the surface of PCB 60
- 63, the lowest array of metal contact balls that forms the interface between the package that is shown in cross section in FIG. 12, the package of FIG. 12 is interconnect to surrounding electrical components by means of contact balls 63
- 64, the upper array of metal contact balls that connect the IC die 61 to the contact pads that have been provided on the surface of the substrate 62
- 65, bond wires that provide further interconnects between the substrate 62 and bond pads that have been provided on the surface of the PCB 60, and
- 66, an encapsulating epoxy based molding.

The disadvantages of the package that is shown in cross section in FIG. 12 is that the wire bonding 65 adds parasitic inductance to the interconnect network which degrades the high-frequency performance of the package. Further, the number of input/output interconnects that can be provided to the IC die 61 of the package of FIG. 12 is limited due to the pitch of the wire bond lines 65.

U.S. Pat. No. 5,811,351 (Kawakita et al.) shows a stacked chip structure with bumps on the overlying chip.

U.S. Pat. No. 5,522,435 (Takiar et al.) shows a stacked multi-chip module.

U.S. Pat. No. 5,994,166(Akram et al.) recites a stack chip package using flip chip contacts.

U.S. Pat. No. 5,952,725(Ball) shows a stacked chip device with solder ball connectors.

U.S. Pat. No. 5,608,262 (Degani et al.) show a method and package for packaging multi-chip modules without using wire bond interconnections.

Article, published as part of the 2000 Electronic Components and Technology conference of May 21, 2000 through May 24, 2000, author: Jean Dufresne, title: Assembly technology for Flip-Chip-on-Chip (FCOC) Using PBGA Laminate Assembly. Reference number: 0-7803-5908-9/00, IEEE.

SUMMARY OF THE INVENTION

A principle objective of the invention is to provide a method of mounting semiconductor devices that allows for the mounting of multiple devices on one supporting medium.

Another objective of the invention is to reduce the package size for a semiconductor package that contains multiple semiconductor devices.

Yet another objective of the invention is to provide a method and package for packaging semiconductor devices that reduces the cost of packaging these devices.

A still further objective of the invention is to provide a method and package for the mounting of multiple chips within one package whereby multiple Ball Grid Arrays chips are mounted on a supporting medium and interconnected within this mounting medium, and whereby multiple solder bumps are provided to the package for external interconnects.

In accordance with the objectives of the invention a new method and package for the mounting of semiconductor devices. A silicon substrate serves as the device-supporting medium, active semiconductor devices have been created in or on the surface of the silicon substrate. Metal interconnect points have been made available in the surface of the silicon substrate that connect to the semiconductor devices. A solder plate is created over the surface of the substrate that aligns with the metal points of contact in the surface of the substrate. Semiconductor devices that have been provided with solder bumps or pin-grid arrays are connected to the solder plate. Underfill is applied to the connected semiconductor devices, the devices are covered with a layer of dielectric that is planarized. Inter-device vias are created in the layer of dielectric down to the surface of the substrate, re-routing interconnect lines are formed on the surface of the dielectric. Contact balls are connected to the re-routing lines after which the semiconductor devices that have been mounted above the silicon substrate are separated by die sawing. At this time, the separated semiconductor devices have two levels of ball interconnects, this can be further extended to for instance three levels of balls interconnect be connecting the second level of ball interconnect to a first surface of a Printed Circuit Board (PCB) while additional contact balls are connected to a second surface of this PCB.

BRIEF DESCRIPTION OF THE DRAWINGS

FIG. 4 shows a cross section of the silicon substrate after BGA chip on wafer clean and reflow.

FIG. 5 shows a cross section after underfill has been applied and cured for the BGA/PGA assembled chips.

FIG. 12 shows a cross section of a Prior Art chip assembly.

FIG. 13 shows a cross section of a simplified version of the basic structure of the package of the invention.

DESCRIPTION OF THE PREFERRED EMBODIMENTS

Figure 1:
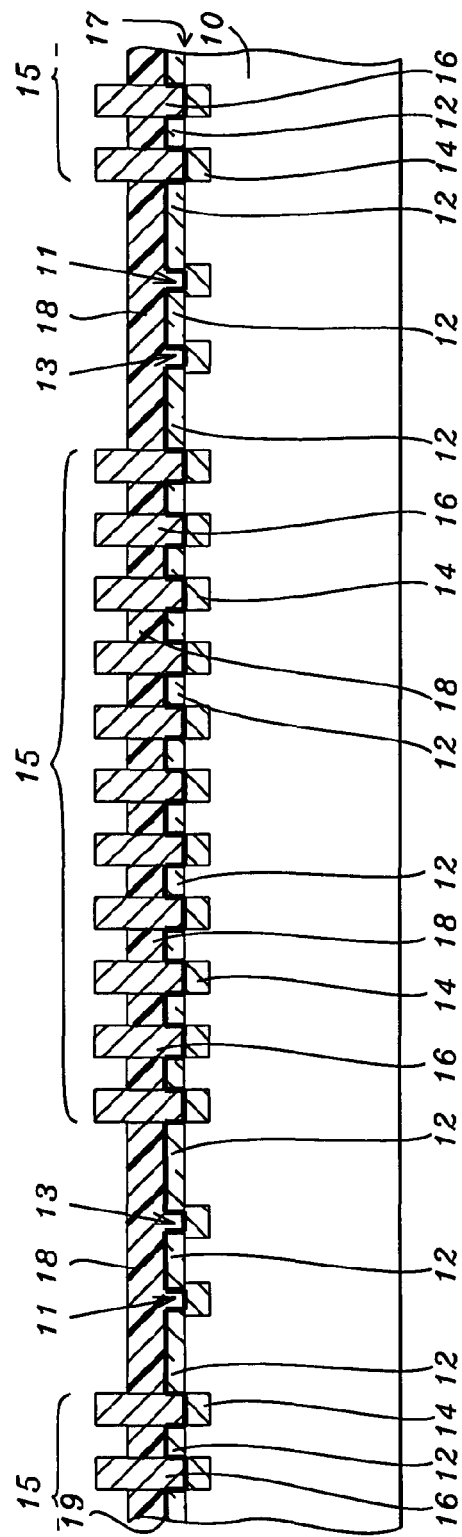
FIG. 1 shows a cross section of a silicon substrate on the surface of which solder plate formation has been completed by conventional plating.

Referring now specifically to FIG. 1, there is shown a cross section of a silicon substrate 10 on the surface of which a solder plate 16 has been deposited. A pattern 14 of metal contact points is provided in or on the surface of the substrate 10, to this pattern 14 overlying semiconductor devices (not shown) will be connected.

Figure 14A:
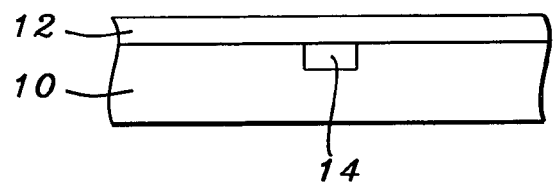
FIGS. 14a through 14e show the processing steps that are required for the creation of solder plate.
Figure 14B:
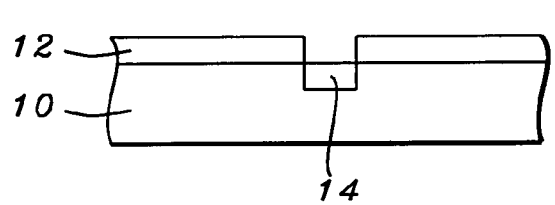
Figure 14C:
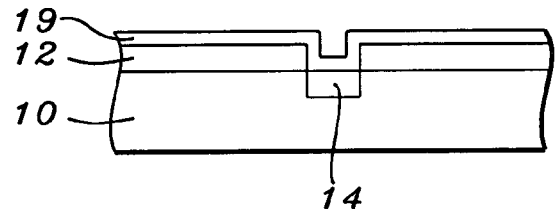
Figure 14D:
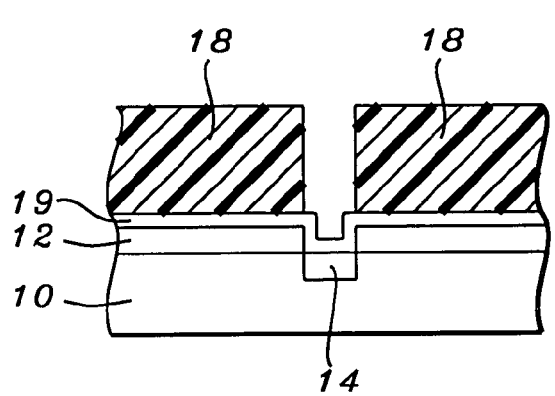
Figure 14E:
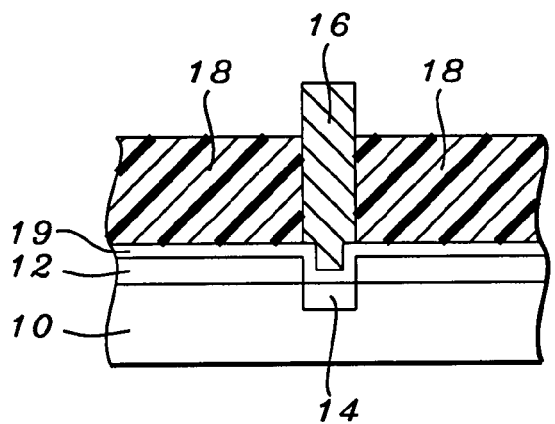

Solder plate 16 is created as follows, see FIG. 14a through 14e:

as a first step in the creation of the solder plate 16, a protective layer 12 of dielectric is deposited over the surface of the substrate 10, FIG. 14a; a first layer of photoresist (not shown) is deposited over the surface of the layer 12 of dielectric; the first layer of photoresist is patterned and etched, creating a pattern of openings in the first layer of photoresist that aligns with a pattern 14 of metal in or on the surface of silicon substrate 10;

openings are created in layer 12 of protective dielectric in accordance with the pattern of openings that has been created in the layer 25 of photoresist, these openings created in layer 12 of protective dielectric therefore align with pattern 14, the surface of pattern 14 is now exposed; the first layer of patterned and developed layer of photoresist is removed from the surface of layer 12 of protective dielectric, FIG. 14b a seed layer 19 is deposited over the surface of the patterned layer 12 of protective dielectric and the surface of the exposed metal pattern 14, FIG. 14c a second layer 18 of photoresist is deposited, patterned and developed, FIG. 14d, creating an opening through this second layer of photoresist that aligns with the metal pattern 14, exposing the surface of the seed layer 19 solder bumps 16 are then created in the openings that have been created in the layer 12 of dielectric, the solder bumps 16 align with the points 14 of electrical contact that have been created in the surface of the substrate 10, FIG. 14e; after the solder bumps 16 have been created, the second layer 18 of photoresist is removed.

For the solder plating of the surface of the substrate, the layer 18 of photoresist functions as the solder mask. Solder bumps 16 are formed, as indicated above, overlying the points 14 of electrical contact in the surface of substrate 10, no solder bumps are formed over the layer 12 of dielectric. The solder bumps 16 therefore in effect "elevate" the points of electrical contact 14 in the surface of the substrate above the layer 18 of photoresist, this to make these points 14 of electrical contact available for connection to semiconductor devices that are positioned above the substrate 10 and whose points of contact make contact with the solder bumps 16 on a per device and a selective basis. It is clear that semiconductor device solder bumps can be brought into contact with the solder plate extrusions 16 and, via these extrusions, with the metal points of contact 14 that have been created in or on the surface of substrate 10.

It must be observed in FIG. 1 that the patterning of the layer 12 of dielectric shows a distinct pattern whereby multiple, closely spaced openings are created over the regions 15 while two openings 11 and 13 are created interspersed between regions 15. The reason for this particular pattern will become clear at a later time (see for instance FIG. 7), the two openings 11 and 13 are the openings that overly the surface area of the substrate 10 along which the bottom substrate 10 will, at a later time in the process of the invention, be separated into individual chips. Regions 15 are the regions over which additional chips (of the multiple chip package of the invention) will be positioned.

For reasons of clarity, the surface 17 of the substrate 10 has been highlighted, contact points 14 have been created in or on the surface 17 of substrate 10.

Figure 2:
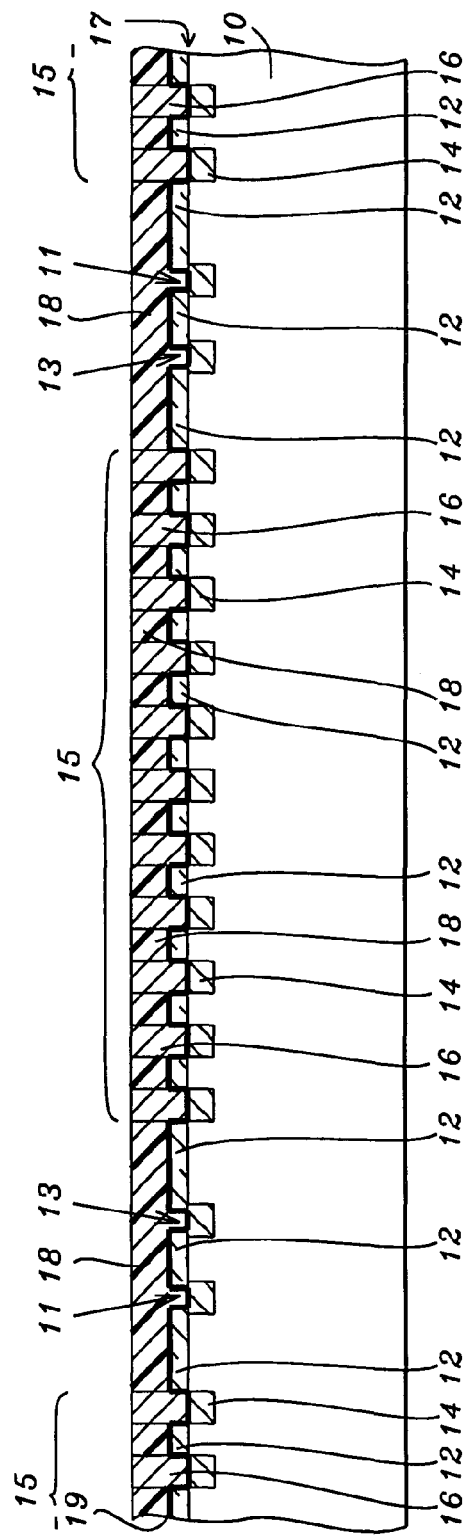
FIG. 2 shows a cross section of a silicon substrate after the layer of solder plate has been planarized.

FIG. 2 shows the results of planarizing the created solder plate 16 of FIG. 1. This planarizing essentially removed the solder bumps 16 from above the surface of the layer 18 of photoresist. After this process of polishing (Chemical Mechanical Planarization or CMP) has been completed, the photoresist 18 is removed from above the surface of the substrate. The seed layer 19 is removed where this seed layer is not masked by metal layer 16, exposing the surface of the patterned layer 12 of dielectric and leaving the now planarized solder bumps 16 in place and ready for connection to an overlying semiconductor device. For reasons of clarity, silicon wafer 10 is also referred to as the bottom chip or device, bottom since (additional) chips will be mounted above the surface of substrate 10.

Figure 3A:
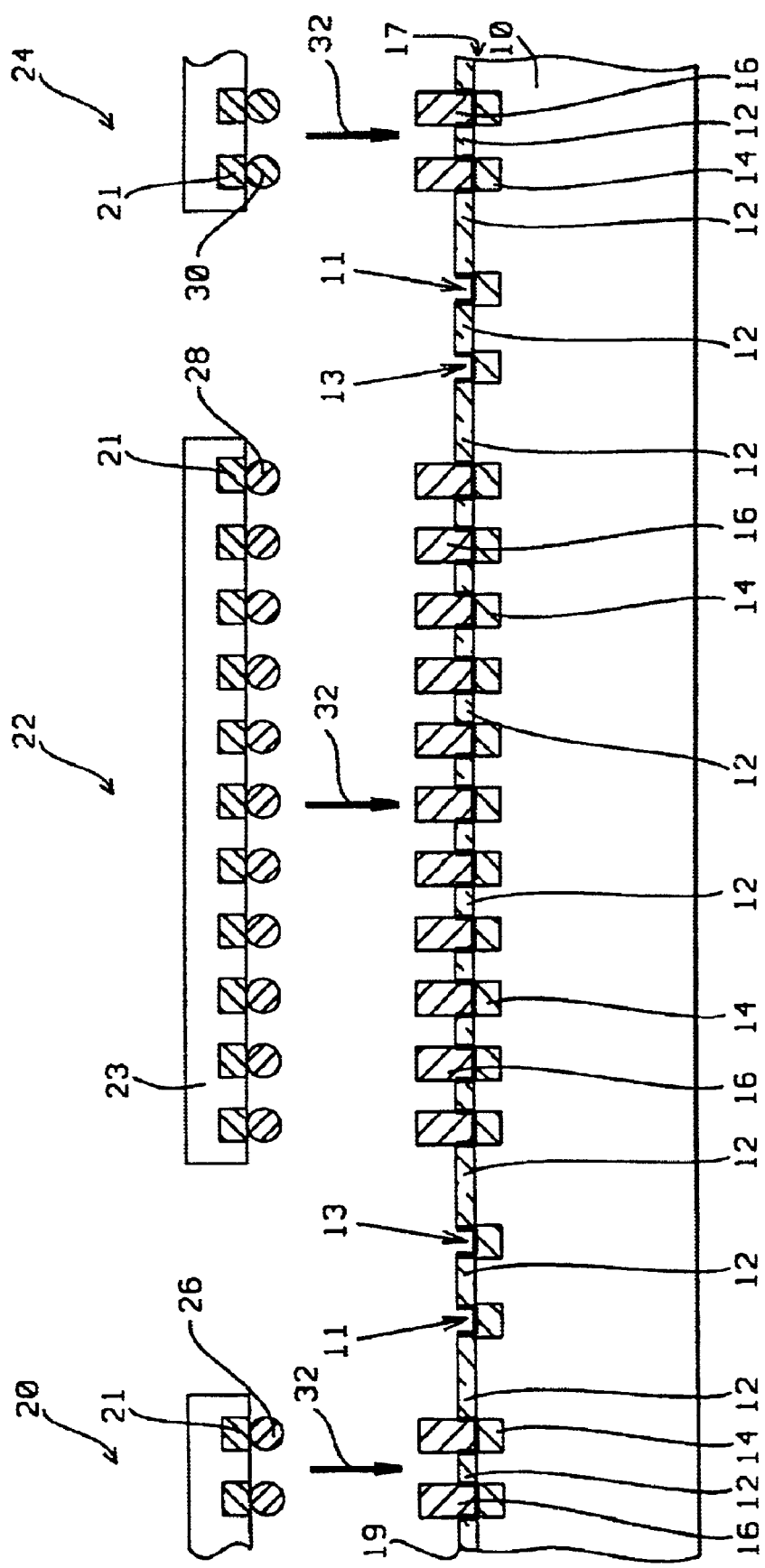
FIGS. 3a and 3b shows a cross section of the silicon substrate during Ball Grid Array (BGA) or chip on wafer assembly.

The substrate (bottom chip) 10 is now ready for the placement of additional semiconductor devices as is shown in FIG. 3a. For this purpose, semiconductor devices 20, 22 and 24, also referred to as top chips, are placed above the bottom chip 10 in alignment with the contact points 14 to which each of these devices must be connected by means of respectively contact balls 26, 28 and 30. For one of the top chips, that is top chip 22, further detail has been highlighted with the highlighting of the metal interconnects 21 of this chip and the silicon substrate 23 of this chip. Similar identifications can be made for the other two chips 22 and 24. Solder balls 28 of top chip 22 are connected to the metal interconnects 21 of chip 22. Again, similar observations can be made with respect to the other two chips 20 and 24.

Figure 3B:
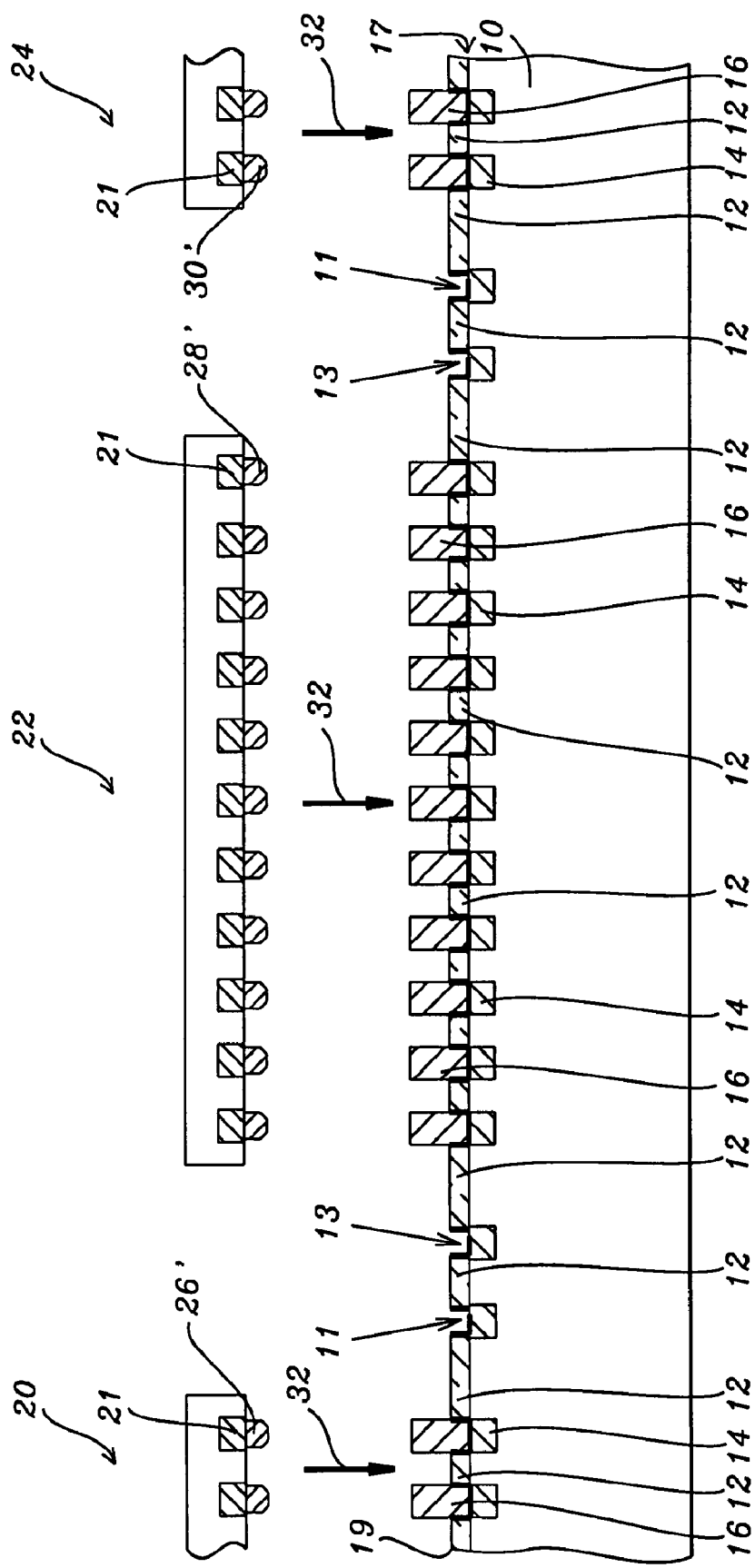

FIG. 3b show a cross section wherein the contact balls 26, 28 and 30 have been replaced with contact pins 26', 28' and 30' of conical shape. The advantage of using conical shaped contact pins 26', 28' and 30' is that these shaped reduce the criticality of the planarizing of the surface with which these contact pins make contact. The conical nature of contact points 26', 28' and 30' allows for easier contacting of these pins with underlying points of contact, this as compared with the spherically shaped contact balls 26, 28 and 30.

Before chips 20, 22 and 24 are brought into contact with the bottom chip 10, a flux coating (not shown) is applied to the surface of the solder bumps 16 to enhance flowing of these solder bumps. The top chips 20, 22 and 24 are then placed above the bottom chip 10 (via a conventional pick and place procedure) and lowered (32) onto the bottom chip 10. Reflow of the solder bumps is performed using conventional methods of reflow, the results of which are shown in FIG. 4.

It must be pointed out at this time that, where FIGS. 3 and 4 show the use of Ball Grid Array devices, the invention is equally applicable for Pin Grid Array (PGA) devices. These PGA devices have not been further shown in the drawings because the similarity as far as the invention is concerned between these two types of devices is obvious and does therefore not require an additional set of drawing.

FIG. 5 shows a cross section after, using conventional methods of syringe insertion, an underfill 34 has been applied to the top chips 20, 22 and 24. The inserted underfill 34, typically epoxy based, fills the gap between the bottom surface (the surface that contains the contact points 21 to the chips 20, 22 and 24) and the surface of the layer 12 of protective dielectric by capillary action. Underfill 34 penetrates between the contact (balls or pins) 28. The underfill 34, after insertion, is cured.

Figure 6:
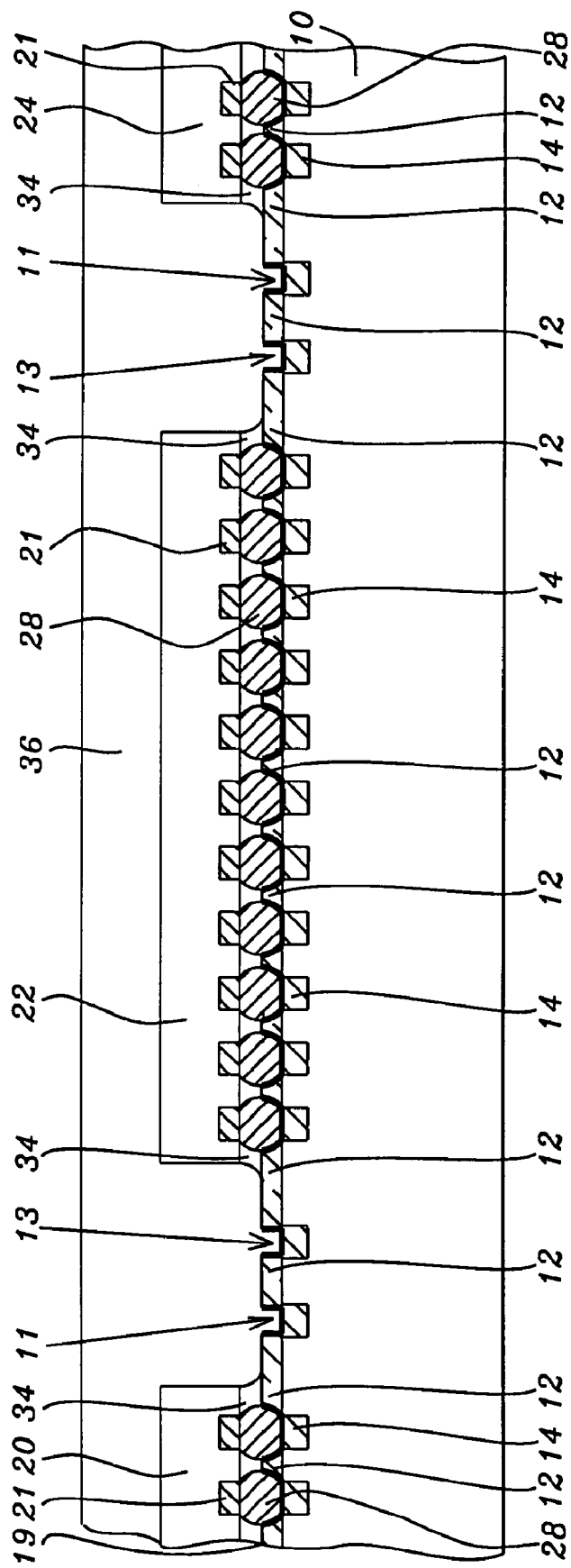
FIG. 6 shows a cross section after a layer of dielectric has been deposited and planarized over the assembled chips.

FIG. 6 shows the results after a dielectric coating 36 has been deposited over the surfaces of the top chips 20, 22 and 24 and in the spaces in between these chips. This coating 36 of dielectric can be deposited using methods of coating or lamination, as known in the art. This layer 36 of dielectric is referred to as a planarization dielectric since it provides a flat or planarized surface to the whole construct.

Figure 7:
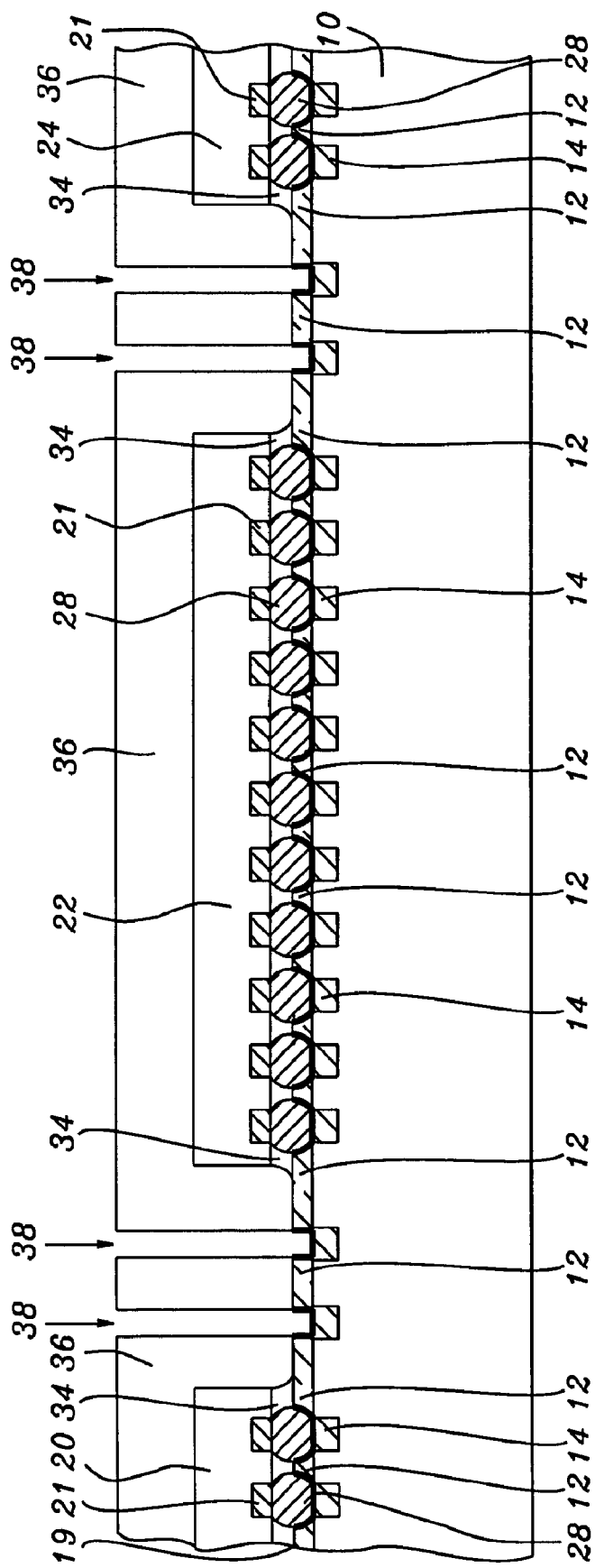
FIG. 7 shows a cross section after via formation in the deposited layer of dielectric for purposes of re-routing.

At this time in the processing sequence of the invention, the top chips of the package are prepared for separation into individual units. Further interconnectivity is provided by a layer of patterned metal that is created over the surface of the planarization dielectric 36. For this reason, and in view that the patterned metal for each top chip must be separated from the patterned interconnect metal of adjacent chips, via openings 38 are created through layer 36 of dielectric such that these via openings are location between adjacent chips. FIG. 7 shows the results of this operation, the via openings 38 can be created using conventional methods of laser drill or photolithography and development. The patterned layer of interconnect metal that is created on the surface of the layer 36 of dielectric has as objective to add to or re-route interconnect metal after the top chips have been separated into individual units, the vias 38 are therefore referred to as re-routing vias.

Figure 8:
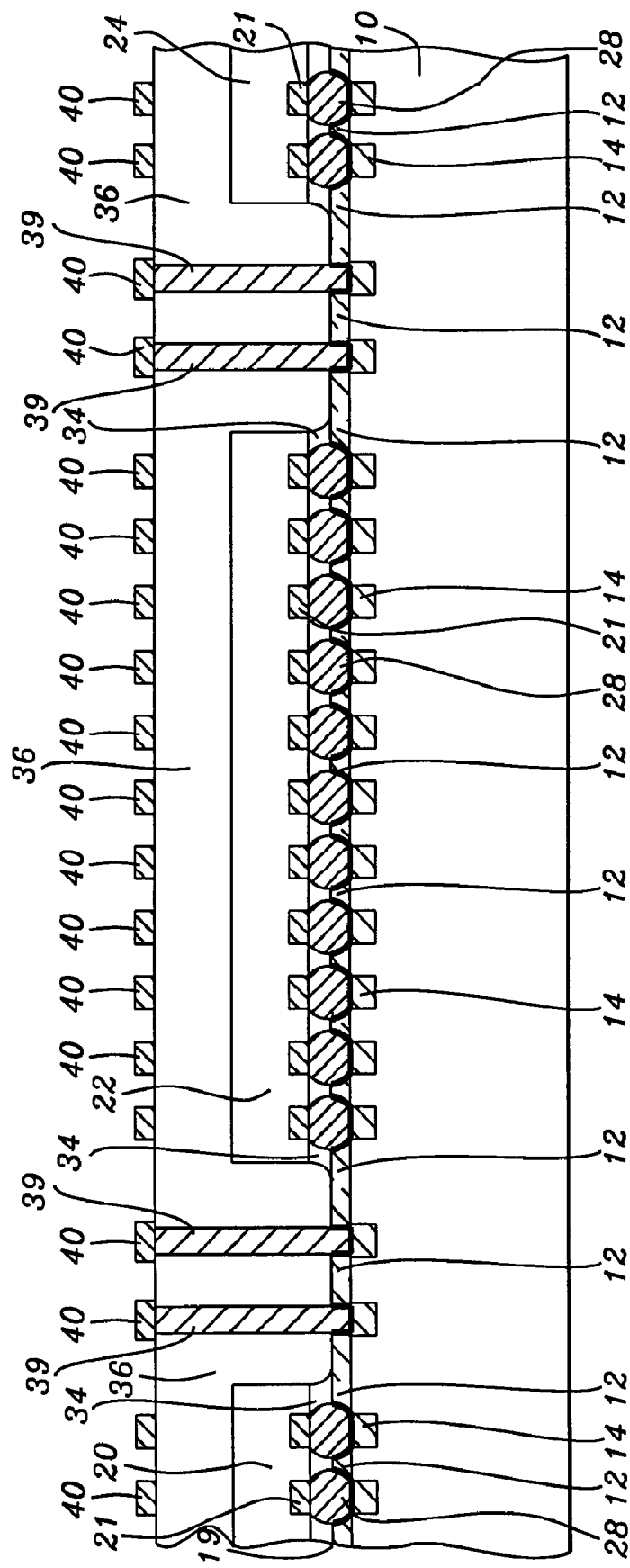
FIG. 8 shows a cross section after re-routing metal has been formed on the surface of the layer of dielectric.

Following, FIG. 8, re-routing interconnect metal is created on the surface of layer 36 of dielectric, this is done by applying in sequence the steps of:

seed metal sputtering of the surface of layer 36
 re-routing photo processing to create the re-routing pattern 40 of metal on the surface of layer 36
 re-routing metal plating to create the interconnect lines 40 of the interconnect network on the surface of each of the top chips 20, 22 and 24 and in accordance with the re-routing pattern of metal created on the surface of layer 36 (preceding step); at the time of this metal plating, the via openings 38 are now filled with metal creating the metal re-routing vias 39, and
 removing the patterned photoresist (that has been used for the re-routing process) from above the surface of the layer 36 of dielectric.

Figure 9:
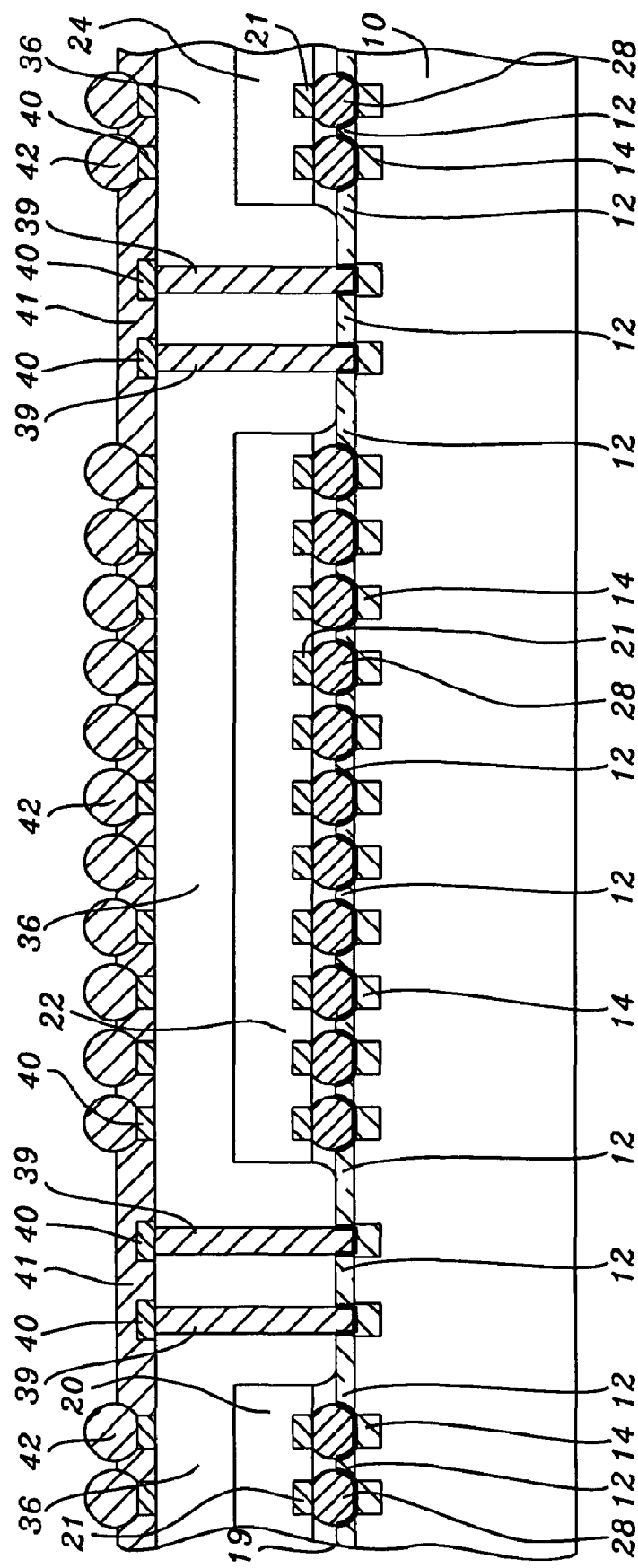
FIG. 9 shows a cross section after solder bump formation on the surface of the re-routed metal.

The re-routing vias 39 can be created using a number of different methods, as follows:

electroless, that is a layer of photosensitive polymer is deposited over the surface of the mounted IC die, openings for the re-routing vias are created in the layer of photosensitive polymer after which electroless plating is used to fill the openings with a via metal
 electroplating, a layer of base metal is created over the surface of the mounted IC die and the exposed surface of the underlying silicon substrate, a layer of photoresist is deposited over the surface of the mounted IC die, openings for the re-routing vias are created in the layer of photoresist, the openings are filled with a via metal using electroplating, the patterned layer of photoresist is removed after which the layer of base metal is etched using methods of wet or dry etch, a layer of polymer is deposited over the surface of the mounted IC die including the surface of the etched layer of base metal
 using conventional methods of creating damascene structures At the completion of this processing sequence, re-routing interconnect network 40 has been completed on the surface of the layer 36 of dielectric. This re-routing interconnect metal is next connected to contact balls 42, FIG. 9, this process uses the following processing steps:

a protective coating 41 of dielectric is applied over the surface of layer 36 of dielectric, including the surface of the interconnect network 40
 a layer of photoresist is deposited and patterned whereby the pattern of the photoresist aligns with the pattern of the layer of re-routing metal (on the surface of layer 36) to which solder bumps must be connected
 the layer of dielectric is etched in accordance with the pattern that has been created in the layer of photoresist, exposing the surface of the re-routing metal
 the exposed surface of the re-routing metal (to which solder bumps must be connected) are electro-plated forming solder deposits over these regions of exposed re-routing metal the patterned layer of photoresist is removed, partially exposing the underlying layer 36 of dielectric, a seed metal is blanket deposited over the surface of the created solder bumps (including the partially exposed surface of the layer 36 of dielectric) and etched, thereby leaving the seed metal in place over the surface of the created solder bumps, and the deposited solder is reflowed, forming solder bumps 42 that are connected with the re-routing metal on the surface of the layer 36 of dielectric.

Figure 10:
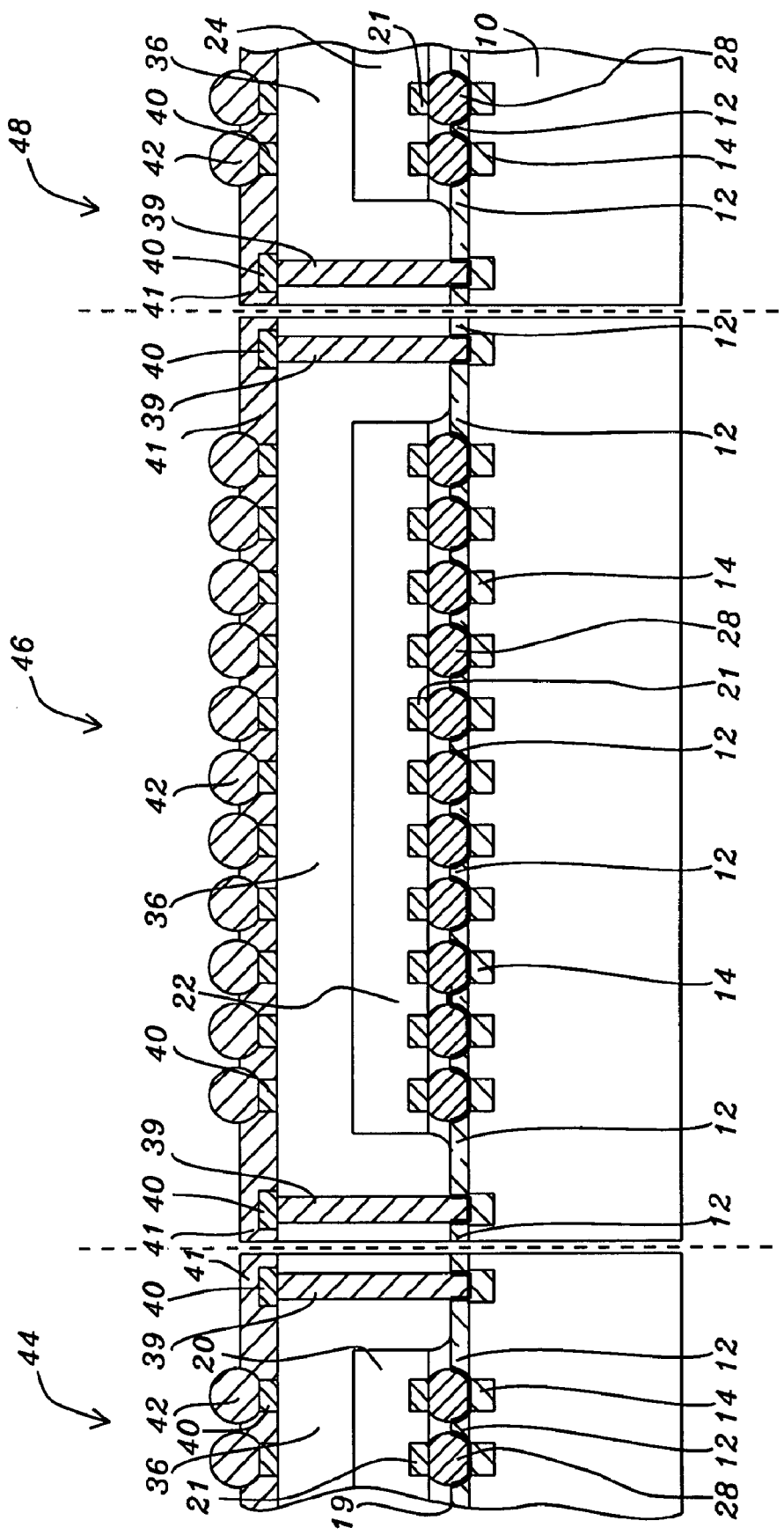
FIG. 10 shows a cross section after the chips have been separated into individual units.

FIG. 10 shows the results of separating the top chips into individual units. Individual units 44, 46 and 48 have now been completed that can further been used for additional packaging.

Figure 11:
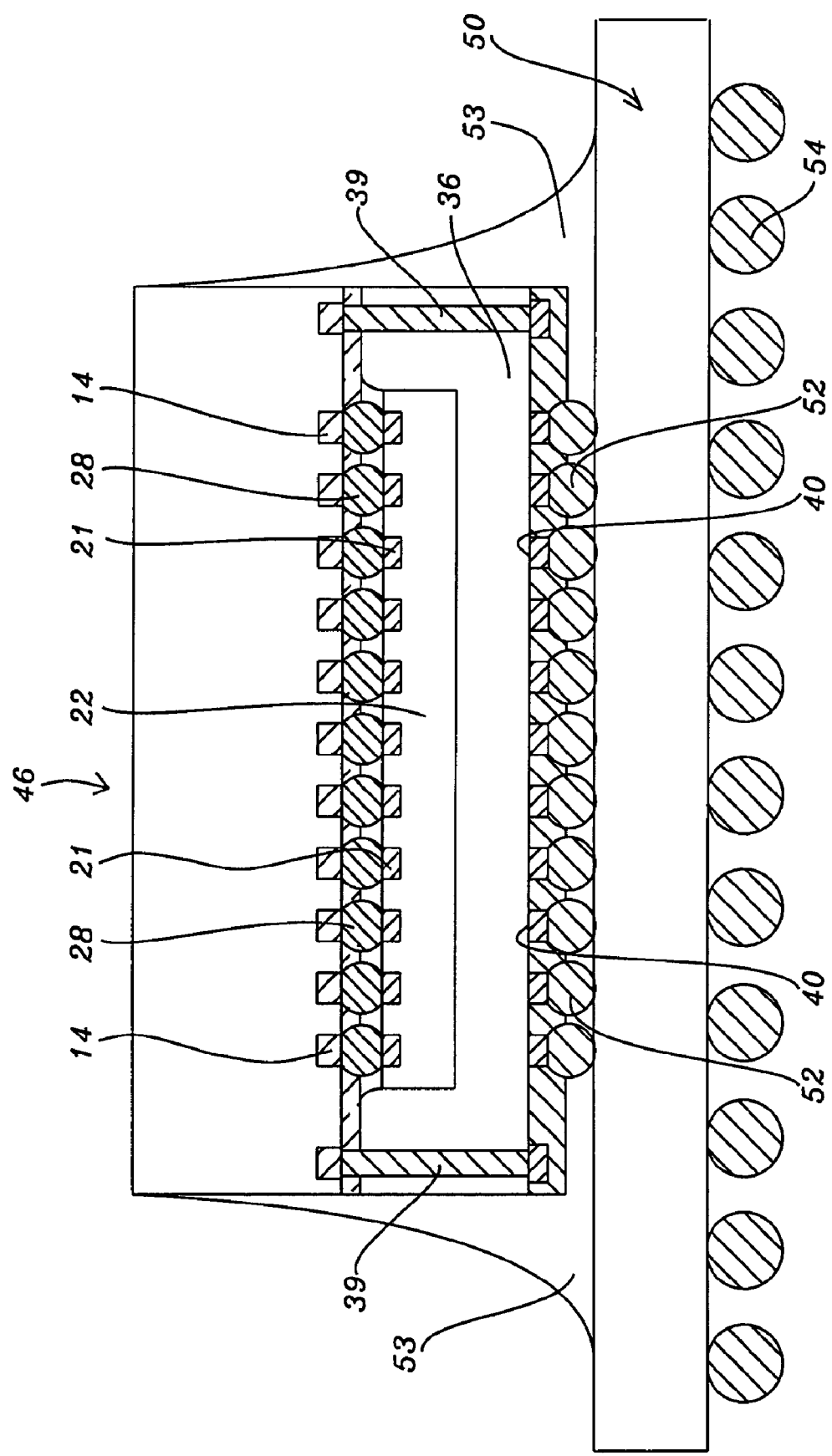
FIG. 11 shows a cross section after individual chip units have been assembled into a flip-chip package.

This additional packaging has been exemplified in FIG. 11 where one of the units 44, 46 or 48 (FIG. 10) has been used to create an additional packaging interface. The individual unit, for instance unit 46, has been selected, turned upside-down so that the contact balls 52 (FIG. 11) now face downwards. These contact balls faced upwards in FIG. 10. Substrate 50, which can be a Printed Circuit Board or any other typical interconnect substrate, has been provided with contact balls 54. Substrate 50 can be of any desired complexity and can contain multiple layers of interconnect metal. A top layer of interconnect metal (not shown) is connected to the contact balls 52 of unit 46, this top layer of interconnect metal is connected to contact balls 54 by means of interconnect metal lines that are routed throughout the substrate 50. The end results is that (top) chip 46 is further connected to an array of contact balls of which contact ball 54 is one member, underfill 53 has been applied to the unit. From FIG. 11 it is clear that the package that is shown in FIG. 11 has three layers of overlying contact balls, that is a top layer of which contact ball 28 (see FIG. 3a) is a member, a center layer of which contact ball 52 is a member and a bottom layer of which contact ball 54 is a member. From this it can be concluded that the invention has added significantly to the method and the packaging capability that can be applied to package semiconductor devices, due to the overlying nature of the arrays of contact balls the package of the invention is more compact while at the same time offering extensive I/O capability. The package of the invention also allows for short interconnects, making this package suitable for packaging high-performance, high frequency devices. In addition, since the process of creating individual packages starts out with a silicon substrate which has considerable surface area. A relatively large number of individual packages can therefore be created in accordance with the invention.

The path of electrical interconnect for the package that has been shown in FIG. 11 can be traced as follows and stating with the contact balls 54 that are connected to the substrate 50:

contact balls 54 are connected to a contact points (not shown) in a first surface of substrate 50 interconnect layers (not shown) have been created in substrate 50, these interconnect layers connect contact balls 54 with contact balls 52 on the second surface of substrate 50 interconnect lines 40 can re-route and further interconnect to the vias 39 which connect interconnect lines 40 with I/O pad 14 contact balls 28 connect interconnect lines 14 with metal contacts 21 in the surface of the silicon substrate 22.

The basic structure of the package of the invention has been shown for purposes of clarity in simplified form in FIG. 13. All the elements that are highlighted in FIG. 13 have previously been identified and need therefore not be repeated at this time. It can be pointed out at this time that the IC die 22 that is mounted in the package of the invention can be of numerous types of application and design such as memory chips, logic and analog chips that further can be created using not only silicon substrates but can be extended to the used of GaAs substrates, further inductor, capacitors and resistive components.

From the above it is clear that the package of the invention can be created in its entirety at the wafer level and that, if so desired, can be created as a post passivation process. The IC die 22 of FIG. 11 can be located above the layer of passivation that has been deposited over a semiconductor substrate. The IC die 22 of FIG. 11 can be located underneath a layer of passivation that is deposited over the surface of the IC die after the IC die has been mounted on a semiconductor substrate.

The invention can, from the above, be summarized as follows:

the invention provides for the simultaneous packaging of more than one semiconductor device after which the semiconductor device package can be separated into individually packaged semiconductor devices, these latter packages can further be used for additional packaging a silicon substrate is provided that contains active devices in its surface and points of electrical contact to these devices a first interface overlays the surface of the substrate, on the surface of this first interface at least one semiconductor device is mounted whereby electrical contact is established between this device and the points of contact of at least one active device in the surface of said substrate; an underfill is provided for the semiconductor device a layer of dielectric is deposited over the semiconductor device and planarized, vias are created through the layer of dielectric and the first interface, contacting the active areas in the surface of the substrate an interconnect network is created on the surface of the layer of dielectric, contacting the points of contacts provided in the active area in the surface of the substrate an array of contact balls is attached to the first network of interconnect lines, including the vias created in the layer of dielectric and the first interface the semiconductor device are singulated by sawing the substrate, creating a partially completed singulated device an interconnect substrate is provided that has been provided with bonding pads and an array of contact balls the partially completed singulated device is aligned with and connected to the bonding pads on the surface of the interconnecting substrate, and an underfill is provided, completing the formation of said semiconductor device package.

The first interface between a semiconductor device and the substrate contains a first layer of dielectric over the surface of the substrate, openings are created in the layer of dielectric that expose the points of electrical contact in the surface of the substrate, solder plating is applied to the points of electrical contact in the surface of the substrate, the solder plating is planarized.

The mounting of a semiconductor device over an active surface area provided in the surface of said substrate comprises the steps of: flux-coating the surface of the first interface, placing a semiconductor devices above the silicon substrate whereby contacts points in the surface semiconductor device align with and contact the contact points provided in an active surface area in the surface of said substrate.

The creation of a first network of interconnect lines on the surface of the layer of dielectric requires sputtering a layer of seed metal over the surface of the layer of dielectric, creating a mask of photoresist in a reverse pattern to the interconnect lines, performing semi-additive plating of the first interconnect network, removing the mask of photoresist and wet etching the plating base thereby removing the plating base where this plating base is not covered with the semi-additive plating.

Attaching a second array of contact balls to the first network of interconnect lines requires creating solder bumps overlying the first network of interconnect lines, including the vias created in the layer of dielectric, and reflowing the solder bumps.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for fabricating a circuit component comprising:
    forming a seed layer over a silicon wafer;
    forming a photoresist layer on said seed layer, wherein an opening in said photoresist layer exposes a region of said seed layer;
    forming a first metal layer over said region;
    after said forming said first metal layer, removing said photoresist layer;
    after said removing said photoresist layer, removing said seed layer not under said first metal layer; and
    after said removing said seed layer not under said first metal layer, mounting a chip over said silicon wafer and joining a metal bump on said chip to said first metal layer.

2. The method of claim 1, after said forming said first metal layer, further comprising polishing said first metal layer, followed by said removing said photoresist layer.

3. The method of claim 1, after said forming said first metal layer, further comprising removing a top portion of said first metal layer, followed by said removing said photoresist layer.

4. The method of claim 1, after said mounting said chip over said silicon wafer and said joining said metal bump on said chip to said first metal layer, further comprising forming an underfill between said chip and said silicon wafer.

5. The method of claim 1, after said mounting said chip over said silicon wafer and said joining said metal bump on said chip to said first metal layer, further comprising separating said silicon wafer into multiple portions.

6. The method of claim 1, after said mounting said chip over said silicon wafer and said joining said metal bump on said chip to said first metal layer, further comprising forming a dielectric layer over said silicon wafer and over said chip.

7. The method of claim 6, after said forming said dielectric layer, further comprising forming an opening in said dielectric layer.

8. The method of claim 6, after said forming said dielectric layer, further comprising forming a second metal layer on said dielectric layer.

9. The method of claim 1, wherein multiple active devices are in or on said silicon wafer.

10. A method for fabricating a circuit component comprising:
    forming a seed layer over a silicon wafer;
    forming a photoresist layer on said seed layer, wherein an opening in said photoresist layer exposes a region of said seed layer;
    forming a first metal layer over said region;
    after said forming said first metal layer, removing said photoresist layer;
    after said removing said photoresist layer, removing said seed layer not under said first metal layer;
    after said removing said seed layer not under said first metal layer, mounting a chip over said silicon wafer and joining a solder bump on said chip to said first metal layer; and
    after said mounting said chip over said silicon wafer and said joining said solder bump to said first metal layer, forming an underfill between said chip and said silicon wafer.

11. The method of claim 10, after said forming said first metal layer, further comprising removing a top portion of said first metal layer, followed by said removing said photoresist layer.

12. The method of claim 10, after said forming said underfill, further comprising separating said silicon wafer into multiple portions.

13. The method of claim 10, after said forming said underfill, further comprising forming a dielectric layer over said silicon wafer and over said chip.

14. The method of claim 13, after said forming said dielectric layer, further comprising forming a second metal layer on said dielectric layer.

15. The method of claim 10, wherein multiple active devices are in or on said silicon wafer.

16. A method for fabricating a circuit component, comprising:
    providing a packaged semiconductor device comprising a first chip, a second chip having a first portion vertically over said first chip, a dielectric layer contacting opposite outer sidewalls of said first chip, a metal interconnect connecting said first chip and said second chip, and multiple metal bumps at a bottom of said packaged semiconductor device and vertically under said first chip;
    after said providing said packaged semiconductor device, joining said multiple metal bumps with a top side of a circuit substrate; and
    providing an array of contact balls on a bottom side of said circuit substrate.

17. The method of claim 16, wherein said first chip comprises a memory chip.

18. The method of claim 16, wherein said multiple metal bumps comprise a solder.

19. The method of claim 16, wherein said dielectric layer has a left outer sidewall and a right outer sidewall opposite and substantially parallel to said left outer sidewall of said dielectric layer.

20. The method of claim 16, wherein said packaged semiconductor device further comprises an underfill between said first and second chips, wherein said underfill contacts a top surface of said first chip and a bottom surface of said second chip, and wherein said metal interconnect is between said first and second chips and in said underfill.

21. The method of claim 16, wherein said metal interconnect comprises a solder.

22. The method of claim 16, wherein said second chip has a second portion overhanging said first chip.

23. The method of claim 16, wherein said multiple metal bumps are further vertically under said second chip.

* * * * *